United States Patent
Shin et al.

(10) Patent No.: US 9,992,862 B2
(45) Date of Patent: Jun. 5, 2018

(54) DISPLAY DEVICE WITH OVERLAPPING FLEXIBLE PRINTED CIRCUITS

(71) Applicant: Samsung Display Co., Ltd., Yongin (KR)

(72) Inventors: Ju-Hyun Shin, Hwaseong-si (KR); In-Su Baek, Seoul (KR); Jee-Na Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 268 days.

(21) Appl. No.: 14/822,078

(22) Filed: Aug. 10, 2015

(65) Prior Publication Data
US 2016/0198560 A1     Jul. 7, 2016

(30) Foreign Application Priority Data
Jan. 7, 2015 (KR) .................. 10-2015-0001983

(51) Int. Cl.
*G02F 1/133* (2006.01)
*H05K 1/02* (2006.01)
(Continued)

(52) U.S. Cl.
CPC ........... *H05K 1/028* (2013.01); *G02B 6/0011* (2013.01); *H05K 1/147* (2013.01);
(Continued)

(58) Field of Classification Search
CPC ........ H05K 1/028; H05K 1/118; H05K 1/147; H05K 1/148; H05K 3/361; H05K 2201/048; H05K 2201/09081; H05K 2201/10128; H05K 2201/10136; G02B 6/0083; G02F 1/13306; G02F 1/13452; G02F 3/0412
See application file for complete search history.

(56) References Cited

U.S. PATENT DOCUMENTS 8,373,835 B2    2/2013  Nobeoka et al.
2005/0195578 A1*  9/2005  Chang ................. G02F 1/13452
                                            361/749
(Continued)

FOREIGN PATENT DOCUMENTS

JP      06-351131       12/1994
JP      2011-095452     5/2011
(Continued)

*Primary Examiner* — Anh Mai
*Assistant Examiner* — Steven Horikoshi
(74) *Attorney, Agent, or Firm* — H.C. Park & Associates, PLC (57) ABSTRACT

A display device includes: a lower substrate; an upper substrate facing the lower substrate; a printed board assembly disposed on a rear surface of the lower substrate; a first flexible printed circuit board having a first end and a second end that are respectively connected to the lower substrate and the printed board assembly; and a second flexible printed circuit board having a first end and a second end that are respectively connected to the upper substrate and the printed board assembly. One of the first flexible printed circuit board and the second flexible printed circuit board has an opening at a central portion, and the other flexible printed circuit board at least partially overlaps the opening in a plane view.

8 Claims, 7 Drawing Sheets

(51) Int. Cl.
*F21V 8/00* (2006.01)
*H05K 1/14* (2006.01)

(52) U.S. Cl.
CPC . *H05K 2201/052* (2013.01); *H05K 2201/056* (2013.01); *H05K 2201/10128* (2013.01)

(56) References Cited

U.S. PATENT DOCUMENTS

| | | | | |
|---|---|---|---|---|
| 2006/0114694 | A1* | 6/2006 | Cho | G02B 6/0083 |
| | | | | 362/631 |
| 2009/0284484 | A1* | 11/2009 | Hwang | G06F 3/0416 |
| | | | | 345/173 |
| 2011/0079501 | A1* | 4/2011 | Arai | G02F 1/13452 |
| | | | | 200/600 |
| 2012/0188195 | A1* | 7/2012 | Fang | G01R 31/2832 |
| | | | | 345/174 |
| 2012/0235948 | A1* | 9/2012 | Inoue | G02F 1/13338 |
| | | | | 345/173 |
| 2014/0049486 | A1 | 2/2014 | Kim et al. | |
| 2014/0049508 | A1 | 2/2014 | Kim et al. | |
| 2015/0097810 | A1* | 4/2015 | Aoki | G06F 3/044 |
| | | | | 345/174 |

FOREIGN PATENT DOCUMENTS

| | | |
|---|---|---|
| JP | 2011-221440 | 11/2011 |
| KR | 10-2014-0023566 | 2/2014 |
| KR | 10-2014-0023567 | 2/2014 |

\* cited by examiner

DISPLAY DEVICE WITH OVERLAPPING FLEXIBLE PRINTED CIRCUITS

CROSS-REFERENCE TO RELATED APPLICATION

This application claims priority from and the benefit of Korean Patent Application No. 10-2015-0001983, filed on Jan. 7, 2015, which is hereby incorporated by reference for all purposes as if fully set forth herein.

BACKGROUND

Field

Exemplary embodiments relate to a display device.

Discussion of the Background

A flat panel display (FPD) such as a liquid crystal display (LCD), an organic light emitting diode display (OLED), and an electrophoretic display (EPD) includes a display panel including a field generating electrode and an electro-optical active layer. As the electro-optical active layer, the display panel of the liquid crystal display includes a liquid crystal layer, the display panel of the organic light emitting diode device includes an organic emission layer, and the display panel of the electrophoretic display includes charged particles. The field generating electrode is connected to a switching device such as a thin film transistor to receive a data signal, and the electro-optical active layer converts the data signal to an optical signal to display an image.

The flat panel display may include a touch sensing function which can interact with a user in addition to the function of displaying an image, and the touch sensing function may be performed by a touch sensor, such as a touch sensing layer. The touch sensing function is used to determine touch information, such as whether an object touches the screen and the touch position thereof, by sensing the change in pressure, charge, light, and the like, which is applied to the screen on the display device, when the user touches the screen with their finger or a touch pen. The display device may also receive an image signal based on the touch information.

This display device may receive an input signal for driving the display active layer of the display panel and a separate signal for driving the touch sensing layer, and a flexible printed circuit board may be employed to transmit these signals.

The above information disclosed in this Background is only for enhancing the understanding of the background of the invention. Therefore, it may contain information that does not form part of the prior art that is already known in this country to a person of ordinary skill in the art.

SUMMARY

Exemplary embodiments provide a display device including a touch sensor, which may have the advantages of ameliorating interference between the flexible printed circuit boards and reducing the area occupied by the flexible printed circuit boards.

Additional aspects will be set forth in the detailed description which follows, and, in part, will be apparent from the disclosure, or may be learned by practice of the inventive concept.

An exemplary embodiment discloses a display device including: a lower substrate; an upper substrate configured to facing the lower substrate; a printed board assembly disposed on a rear surface of the lower substrate; a first flexible printed circuit board having a first end and a second end that are respectively connected to the lower substrate and the printed board assembly; and a second flexible printed circuit board having a first end and a second end that are respectively connected to the upper substrate and the printed board assembly, wherein one of the first flexible printed circuit board and the second flexible printed circuit board has an opening at a central portion, and the other flexible printed circuit board at least partially overlaps the opening in a plane view.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A liquid crystal display according to an exemplary embodiment of the present disclosure will now be described in detail with reference to accompanying drawings. Hereinafter, even though the present disclosure is mainly described in association with a liquid crystal display, the present disclosure may be applied to other display devices such as an organic light emitting diode display and an electrophoretic display.

Figure 1:
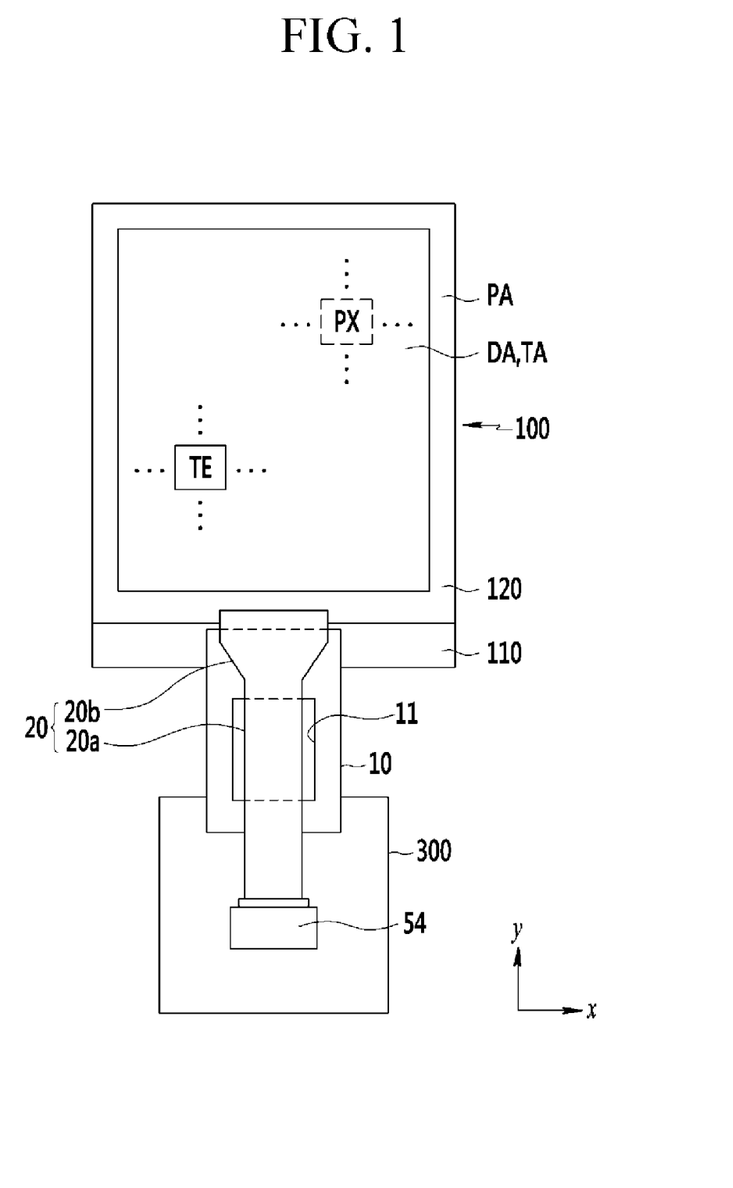
FIG. 1 is a plan view schematically illustrating a structure of a flexible printed circuit board before being bent, in a display device according to an exemplary embodiment of the present disclosure.
Figure 2:
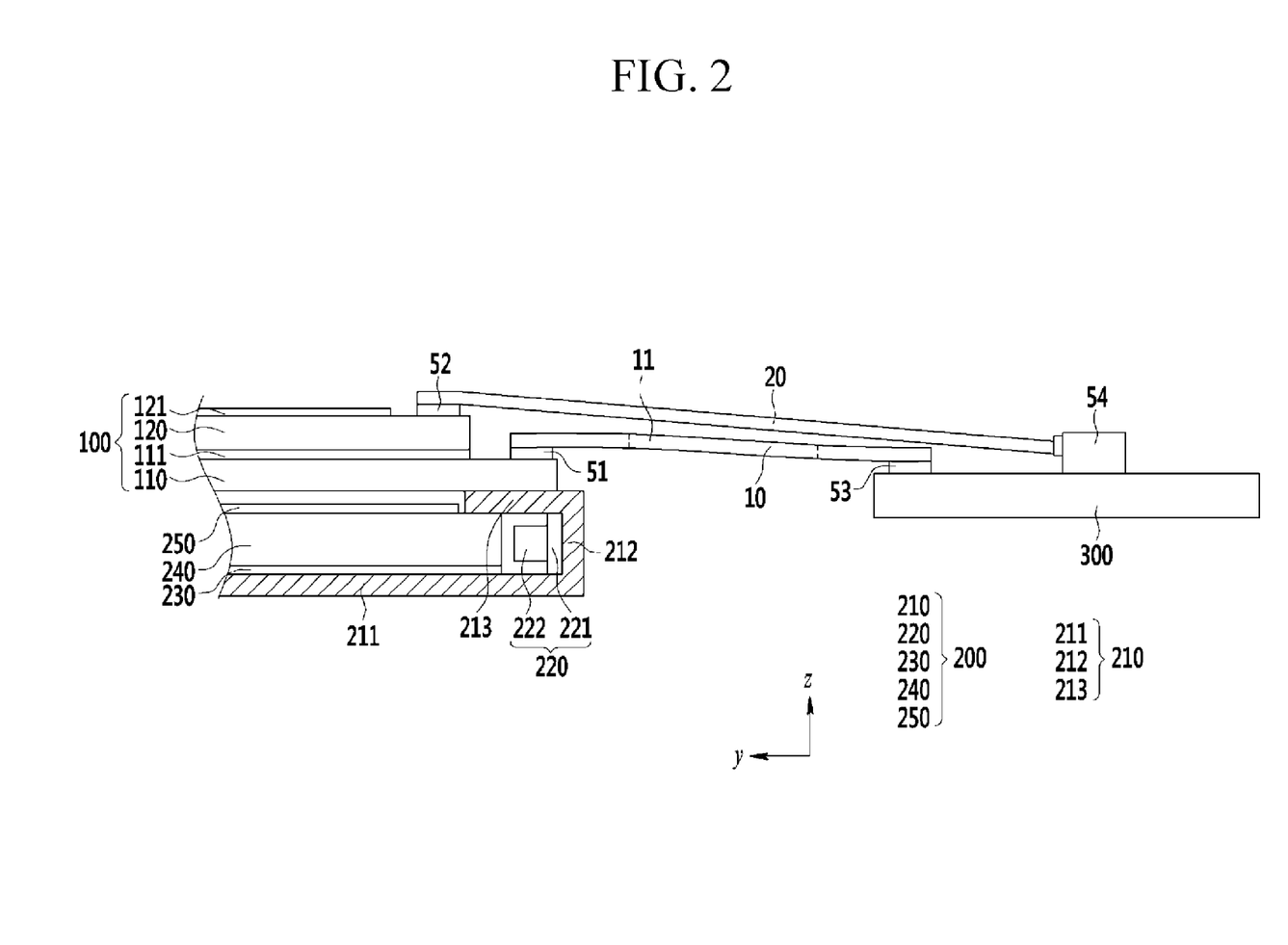
FIG. 2 is a partial cross-sectional view of the display device shown in FIG. 1.

FIG. 1 and FIG. 2 illustrate a structure of a display device before a flexible printed circuit board (FPCB) is bent to be attached to a rear surface of a backlight unit.

A display device according to an exemplary embodiment of the present disclosure includes display panel 100 for displaying an image and sensing a touch, and backlight unit 200 for supplying light to display panel 100. In the case that the display device is a self-emissive display device such as an organic light emitting diode device, the display device may not include backlight unit 200. The display device includes printed board assembly (PBA) 300 in which various elements are mounted to drive display panel 100, and first and second flexible printed circuit boards 10 and 20 for transmitting signals between display panel 100 and printed board assembly 300.

Display panel 100 includes display area DA in which the image is actually displayed, and a peripheral area PA positioned around display area DA when viewed from a planar structure. A plurality of pixels PX are disposed in display area DA.

A portion or an entire area of display panel 100 may serve as touch area TA for sensing touch. Touch area TA is an area which is capable of sensing touch or a motion as a touch when an object directly touches display panel 10 (contact touch) or hovers while being close to or approaching display panel 10 (non-contact touch). Display area DA and touch area TA may substantially coincide with each other, but are not limited thereto. For example, touch area TA may also be positioned at a portion of peripheral area PA, and touch area TA may be exclusively positioned in display area DA.

Display active layer 111 is disposed on a lower substrate 110 made of a transparent insulator such as glass. Display active layer 111 includes a plurality of pixels and a plurality of display signal lines (not shown) connected to the pixels and transmitting driving signals, and is mainly disposed at display area DA The display signal lines include a plurality of gate lines (not shown) for transmitting gate signals and a plurality of data lines (not shown) for transmitting data signals. The gate lines and the data lines may be disposed to extend to cross each other. The display signal lines may be disposed to extend into peripheral area PA, thereby forming lower pad 51.

The pixels may be arranged substantially in a matrix form, but are not limited thereto. Each pixel may include a switching element (not illustrated) connected to the gate line and the data line, a pixel electrode (not illustrated) connected thereto, and an electro-optical active layer (not illustrated). Each pixel may include a switching element (not illustrated) connected with the gate line and the data line, and a pixel electrode (not illustrated), connected thereto. The switching element is turned on or off according to the gate signal transferred by the gate line to selectively transfer the data signal transferred by the data line to the pixel electrode. In the case of the liquid crystal display, the electro-optical active layer may serve as a liquid crystal layer. In the case of the organic light emitting diode device, the electro-optical active layer may serve as an organic emission layer. Each pixel may further include a common electrode (not shown) disposed to face the pixel electrode. In the case of the liquid crystal display, the common electrode may be disposed in upper substrate 120.

In order to implement color display, each pixel may display one of primary colors, and a desired color may be recognized by combining the primary colors. An example of the primary colors may include three primary colors or four primary colors such as red, green, blue, and the like. Each pixel may further include a color filter disposed at a place corresponding to each pixel electrode and expressing one of the primary colors, and the emission layer included in the light emitting element may emit colored light.

Touch sensing layer 121 is formed on upper substrate 120 made of a transparent insulator such as a glass substrate. Touch sensing layer 121 includes a plurality of touch electrodes (not shown) and touch lines for transmitting and/or receiving signals to and from the touch electrodes. The touch electrodes are mainly disposed at touch region TA. The touch signal lines may be disposed to extend to peripheral area PA to thereby form upper pad unit 52 on upper substrate 120. Upper pad unit 52 and lower pad unit 51 disposed on lower substrate 110 may be positioned in the same line in a y-axis direction.

For example, touch sensing layer 121 may sense a touch by using a capacitive method. Adjacent touch electrodes may constitute a mutual capacitor serving as a touch sensor, and the mutual capacitor may receive a driving signal through one of the touch electrodes and output a sensing signal indicating a change in charge amount caused by a touch through the other touch electrode. Each of the touch electrodes constitutes a self-capacitor as a touch sensor. In this case, the self-capacitor may be charged to a predetermined level by receiving a driving signal. The charged amount is changed when the self-capacitor is contacted by an external object such as a finger, and thus the self-capacitor may output a sensing signal that is different from an inputted driving signal.

Lower substrate 110 and upper substrate 120 are sealed by a sealing member (not shown) in peripheral area PA, and the sealing member may be disposed to surround display area DA as a closed curve. In the case of the liquid crystal display, a liquid crystal layer may be disposed between lower substrate 110 and upper substrate 120. However, in the case of another liquid crystal display, no upper substrate may be disposed, and a liquid crystal may be injected into a microcavity. In the case of the organic light emitting diode device, upper substrate 120 may serve as an encapsulation substrate for preventing penetration of moisture and oxygen from the outside.

In the case of the liquid crystal display, a polarizer (not shown) is attached below lower substrate 110 and above upper substrate 120. The polarizer may serve to allow a wavelength band of light that vibrates in one direction to pass therethrough by polarizing all wavelength bands of light that are introduced into the display panel. In the case of the organic light emitting diode device, an anti-reflective layer (not shown) for reducing reflection of external light is formed on upper substrate 120. The anti-reflective layer may be a polarization layer such as a linear polarizer, a retarder, or the like.

Backlight unit 200 disposed at a rear surface of display panel 100 includes bottom chassis 210, light source unit 220 accommodated in bottom chassis 210, reflective sheet 230, light guide 240, and optical sheet 250.

Bottom chassis 210 has an open upper side, and serves as a kind of container with an accommodating space having a predetermined depth. Bottom chassis 210 may further include substantially flat bottom portion 211, sidewall 212 formed to upwardly extend from a circumference of bottom portion 212, and wing portion 213 formed to inwardly extend from sidewall 212. Bottom portion 211 and sidewall 212 constitute the accommodating space, and display panel 100 may be attached to wing portion 213. This structure of bottom chassis 210 is merely an example, and various modifications are possible. Bottom chassis 210 may be made of a metal material such as an aluminum plate or an aluminum alloy plate, and a galvanized steel sheet. Alternatively, bottom chassis 210 may be made of a plastic material such as polycarbonate (PC).

Light source unit 220 is disposed at one edge of bottom chassis 210. Light source unit 220 may include substrate 221 and light source 222 mounted therein. Substrate 221 entirely has an elongated bar shape having a narrow width. Substrate 221 serves to supply power to light source 222 while supporting light source 222. Substrate 221 may be a circuit board, particularly a metal core printed circuit board (MCPCB). Light source 222 is electrically connected to substrate 221 to receive power, and then converts electrical energy to light energy to emit the light energy. Light source 222 may include a light emitting diode (LED) package, and include a plurality of light sources 222 that are disposed at a predetermined interval in one substrate. In addition to the LED package, a point light source or a linear light source may be employed as light source 222.

Light guide 240 is disposed within bottom chassis 210 such that edges of light guide 240 and light source 222 are adjacent to each other. Light guide 240 serves to guide light emitted from light source 222 and transfer the light to display panel 100. Light guide 240 may be made of a polymethyl methacrylate (PMMA) material having light transmittance, or a metastyrene (MS) material having excellent thermal resistance and humidity resistance. Light guide 240 serves to convert light having light distribution in a form of a point or a linear light source emitted from light source unit 220 into light having distribution in a form of a surface light source, i.e., serves to uniformly distribute light. A pattern may be formed on one surface or opposite surfaces of light guide 240.

Reflective sheet 230 may be disposed below light guide 240, i.e., between light guide 240 and bottom chassis 210. Reflective sheet 230 serves to increase light efficiency by reflecting light passing toward a lower side of light guide 240 and allowing the reflected light to finally pass toward display panel 100. Reflective sheet 230 may be made of a plastic material such as polyethylene terephthalate (PET), polycarbonate (PC), or polystyrene (PS). Reflective sheet 230 may include a light reflective material such as titanium dioxide ($TiO_2$) in order to increase light reflectance.

Optical sheet 250 is disposed on light guide 240. Optical sheet 250 may include a diffuser sheet, a prism sheet, a protecting sheet, and the like. The diffuser sheet serves to diffuse light emitted from light guide 240 to accomplish uniform luminance distribution as a surface light source having a uniform brightness. The prism sheet serves to adjust a moving direction of light diffused by the diffuser sheet such that the light is perpendicular to display panel 100. The protecting sheet may be used to protect a prism of the prism sheet against scratches or the like. The protecting sheet may also serve to widen a viewing angle that is narrowed by the prism sheet by diffusing light. Optical sheet 250 may not include any one of the prism sheet and the protecting sheet, and may include a plurality of prism sheets or protecting sheets. Optical sheet 250 may further include another optical sheet having other characteristics. For example, optical sheet 250 may further include a reflective polarizing sheet serving to increase luminance efficiency by separating polarized components from light to allow the separated components of light to pass therethrough and to be reflected.

Printed board assembly 300 includes a printed circuit board (PCB), and various elements mounted in the PCB to drive display panel 100. For example, an integrated circuit chip (not shown) including a pixel driver for driving pixels of display active layer 111 of display panel 100 may be mounted in printed board assembly 300. This pixel driver may include a data driver for applying a data voltage to a data line, a gate driver for applying a gate-on voltage to a gate line, a signal controller for controlling operations of the data driver and the gate driver, and the like. These drivers may be integrated in integrated circuit chips one by one, two or more of these drivers may be combined and integrated in one integrated circuit chip, or some of the drivers may be integrated in display panel 100.

Further, an integrated circuit chip (not shown) including a touch sensor driver for driving a touch sensor of touch sensing layer 121 of display panel 100 may be mounted in printed board assembly 300. This integrated circuit chip may be disposed in first flexible printed circuit board 10 or second flexible printed circuit board 20, or may be disposed in peripheral area PA of display panel 100.

A signal for driving display active layer 111 of display panel 100 may be applied through first flexible printed circuit board 10. An entire shape of first flexible printed circuit board 10 may be substantially quadrangular. First flexible printed circuit board 10 has opening 11 at a substantially central portion of the board. In brief, first flexible printed circuit board 10 has an entirely quadrangular shape and includes a hole at a central portion thereof. Opening 11 may also be substantially quadrangular, and thus first flexible printed circuit board 10 may have a substantially quadrangular donut shape. Four edges of opening 11 may be parallel with four edges of first flexible printed circuit board 10.

A first end and a second end of the first flexible printed circuit board 10 are respectively attached to lower pad unit 51 disposed in lower substrate 110 of display panel 100 and a substrate pad unit 53 disposed in printed board assembly 300. A film such as an anisotropic conductive layer (ACF) may be employed for attachment of the first flexible printed circuit board 10.

Lower substrate 110 is formed longer than upper substrate 120 such that lower pad unit 51 formed on lower substrate 110 is not covered by upper substrate 120 and is exposed, and thus first flexible printed circuit board 10 can be attached on lower pad unit 51. However, the remaining edges of substrates 110 and 120 are aligned with each other, other than edges at which flexible printed circuit board 10 is attached.

A signal for driving touch sensing layer 121 of display panel 100 may be applied through second flexible printed circuit board 20. Second flexible printed circuit board 20 may have a substantially T-shape. For example, as shown in FIG. 1, second flexible printed circuit board 20 includes quadrangular first portion 20a and second portion 20b that is wider than first portion 20a. Second portion 20b may have a first area of which a width is gradually increased and a second area of which a width is constant. The width of first portion 20a of second flexible printed circuit board 20 is narrower than that of opening 11 of first flexible printed circuit board 10. The length of first portion 20a of second flexible printed circuit board 20 is longer than that of opening 11 of first flexible printed circuit board 10.

The first end and second end of second flexible printed circuit board 20, which is close to second portion 20b thereof, are respectively attached to upper pad unit 52 disposed in upper substrate 120 of display panel 100 and connector 54 disposed in printed board assembly 300. Connector 54 may be a zero insertion force (ZIF) connector. The second end of second flexible printed circuit board 20 may be connected to connector 54 after printed board assembly 300 is attached to the rear surface of backlight unit 200. According to another exemplary embodiment, the second end of second flexible printed circuit board 20 may also be attached to a pad unit (not shown) disposed in printed board assembly 300.

Second flexible printed circuit board 20 is disposed above the first flexible printed circuit board 10 to be partially overlapped therewith before printed board assembly 300 to which first flexible printed circuit board 10 and second flexible printed circuit board 20 are connected is attached to the rear surface of backlight unit 200. For easy description, an upper portion, a lower portion, and opposite side portions of first flexible printed circuit board 10 are defined with respect to opening 11 thereof. Second portion 20b of second flexible printed circuit board 20 is overlapped with the upper portion of first flexible printed circuit board 10 (particularly, the first end thereof attached to lower pad unit 51). First portion 20a of second flexible printed circuit board 20 is overlapped with opening 11 and the lower portion (particularly, the second end thereof attached to substrate pad unit 53) of first flexible printed circuit board 10, but is not overlapped with the side portions thereof. Accordingly, when viewed in a plan view, opening 11 of first flexible printed circuit board 10 may be exposed to opposite sides of first portion 20a of second flexible printed circuit board 20. Further, the vertically (y-axis directionally) central axis of opening 11 of first flexible printed circuit board 10 may be substantially aligned with the vertically central axis of first portion 20a of second flexible printed circuit board 20.

Figure 3:
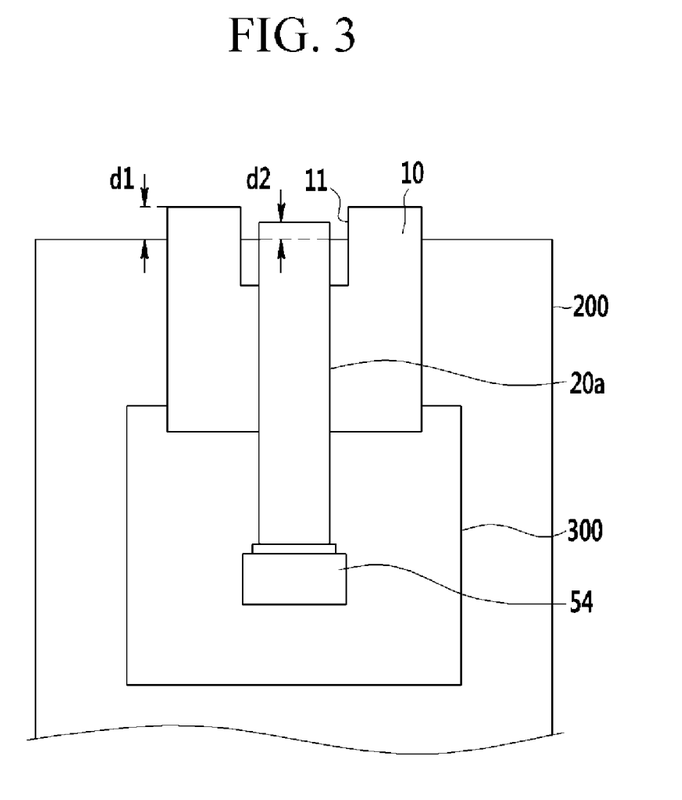
FIG. 3 is a top plan view schematically illustrating a structure in which the flexible printed circuit board in the display device of FIG. 1 is bent to be attached to a rear surface of a lower substrate.
Figure 4:
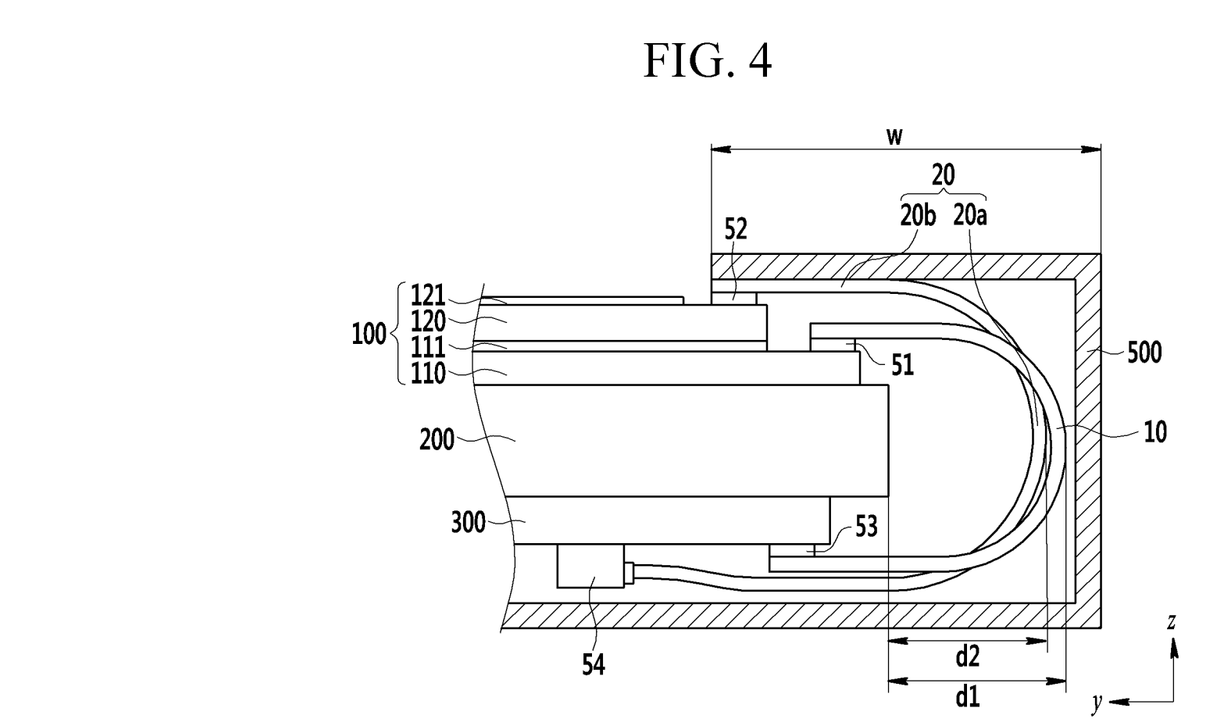
FIG. 4 is a side view of the display device illustrated in FIG. 3.

FIG. 1 and FIG. 2 illustrate a state in which first and second flexible printed circuit boards 10 and 20 are respectively connected to lower and upper pad units 51 and 52 of display panel 100, substrate pad unit 53 of printed board assembly 300 and connector 54. FIG. 3 and FIG. 4 illustrate a state in which first and second flexible printed circuit boards 10 and 20 are bent while partially surrounding an edge of display panel 100, to be attached to the rear surface of backlight unit 200 together with printed board assembly 300. Unlike FIG. 1, FIG. 2, and FIG. 3, FIG. 4 illustrates a state in which set cover 500 is coupled thereto.

Referring to FIG. 3 and FIG. 4, printed board assembly 300, in which the second ends of first flexible printed circuit board 10 and second flexible printed circuit board 20 are connected to each other is attached to the rear surface of backlight unit 200. For example, a double-sided adhesive tape may be employed for the attachment of printed board assembly 300. In the meantime, in the case of the organic light emitting diode device, no backlight unit is provided, and thus printed board assembly 300 may be attached to the rear surface of lower substrate 110. In this case, a cushion layer (not shown) may be disposed between lower substrate 110 and printed board assembly 300 to reduce impact of printed board assembly 300 that is applied to lower substrate 110. In this specification, in the case of including backlight unit 200, the expression of being attached to the rear surface of lower substrate 110 includes a case of being attached to the rear surface of backlight unit 200.

When printed board assembly 300 is attached thereto, first and second flexible printed circuit boards 10 and 20 are bent while surrounding side surfaces of lower substrate 110 and backlight unit 200. Bent portions of first and second flexible printed circuit boards 10 and 20 are formed to protrude by a predetermined degree from the edge of lower substrate 110 or the side surface of backlight unit 200 instead of being closely attached thereto due to the characteristic of the flexible printed circuit board in which a basic layer including a base film, a circuit layer, a cover film is stacked as a single layer or a multi-layer. This protrusion causes dead space, and bezel width w may be reduced by decreasing dead space.

When viewed in a plan view, in a state in which first and second flexible printed circuit boards 10 and 20 are bent, a portion of first portion 20a of second flexible printed circuit board 20 is overlapped with opening 11 of first flexible printed circuit board 10. When viewed in a side view, in the state in which first and second flexible printed circuit boards 10 and 20 are bent, first flexible printed circuit board 10 and second flexible printed circuit board form different curvature trajectories. For the curvature trajectories, a second curvature trajectory of second flexible printed circuit board 20 is positioned at an outer side of the first curvature trajectory of first flexible printed circuit board 10, above lower substrate 110 and below printed board assembly 300. However, the second curvature trajectory of second flexible printed circuit board 20 goes across the first curvature trajectory of first flexible printed circuit board 10 and is positioned at an inner side of the first curvature trajectory. According to another exemplary embodiment, the second curvature trajectory of second flexible printed circuit board 20 may be positioned in substantially the same level as that of first flexible printed circuit board 10.

As such, although the second curvature trajectory of second flexible printed circuit board 20 is positioned at the outer side of the first curvature trajectory of first flexible printed circuit board 10 at opposite sides, the second curvature trajectory of second flexible printed circuit board 20 can be positioned at the inner side of the first curvature trajectory of first flexible printed circuit board 10 at a central portion. This is because opening 11 is formed in first flexible printed circuit board 10, and first portion 20a of second flexible printed circuit board 20 which overlaps opening 11 and has a width narrower than that of opening 11 is positioned therein, and thus second flexible printed circuit board 20 can be designed to be shorter as compared with the case that opening 11 is not formed in first flexible printed circuit board 10. Accordingly, even when the second curvature trajectory of second flexible printed circuit board 20 coincides with the first curvature trajectory of first flexible printed circuit board 10 or is positioned at the inner side thereof at a bent portion, no interference is generated therebetween.

Referring to FIG. 4, the bent portion of first flexible printed circuit board 10 is protruded from the side surface of backlight unit 200 by the length of first distance d1. The bent portion of second flexible printed circuit board 20 is protruded by the length of second distance d2 which is shorter than first distance d1. Accordingly, bezel width w is determined by first distance d1, and the increase of bezel width w is not affected by second flexible printed circuit board 20. Specifically, flexible printed circuit boards 10 and 20 may be bent without interfering with or contacting each other within a side space that is restricted by first distance d1 of the bent portion of flexible printed circuit board 10.

Figure 5:
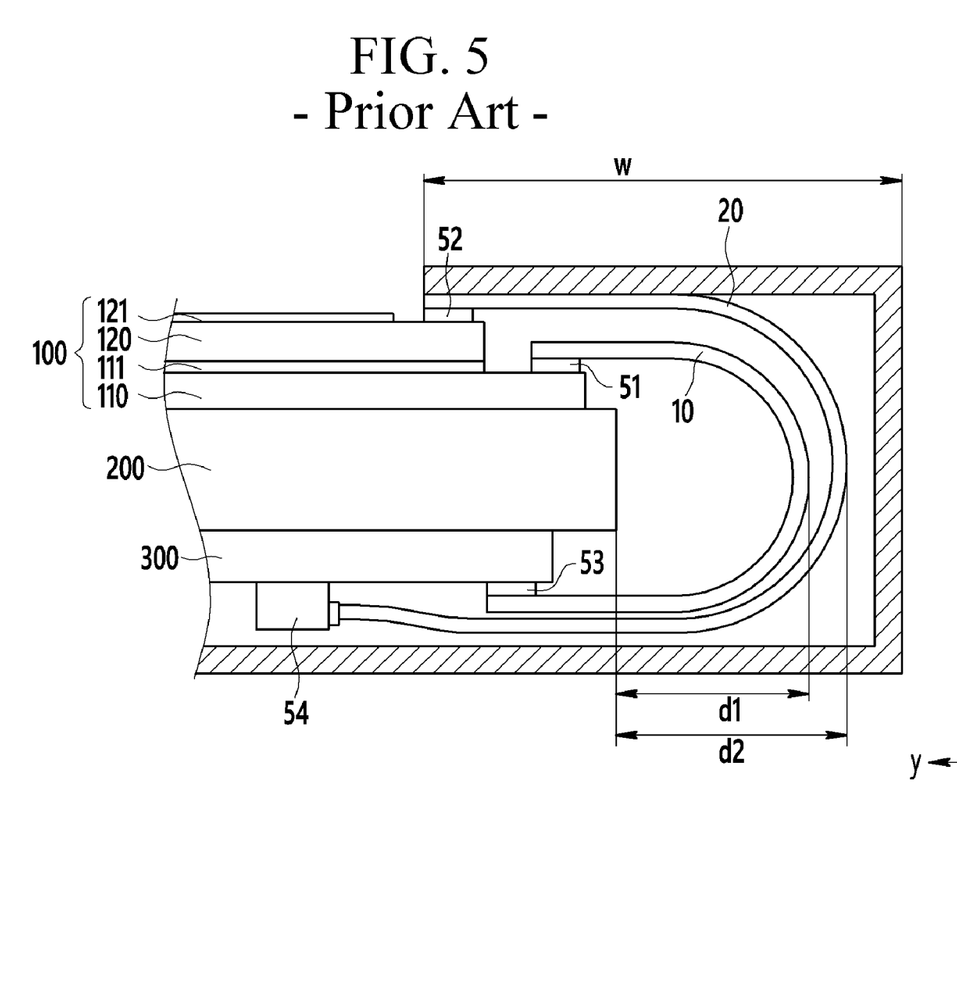
FIG. 5 is a side view schematically illustrating a structure in which the flexible printed circuit board in a display device according to a comparative embodiment is bent to be attached to a rear surface of a lower substrate.

The display device of FIG. 5 is similar to the display device according to the aforementioned exemplary embodiment except that an opening that is overlapped with first portion 20a of second flexible printed circuit board 20 is not formed in first flexible printed circuit board 10. When printed board assembly 300 in which first flexible printed circuit board 10 and second flexible printed circuit board 20 are connected to each other is attached to the rear surface of backlight unit 200, first flexible printed circuit board 10 and second flexible printed circuit board 20 are bent along the side surface of backlight unit 200. In this case, it is required to position a second curvature trajectory of second flexible printed circuit board 20 at an outer side of the first curvature trajectory of first flexible printed circuit board 10 with an interval therebetween in order to prevent second flexible printed circuit board 20 from interfering with first flexible printed circuit board 10. Accordingly, third distance d3, by which a bent portion of second flexible printed circuit board 20 is protruded from backlight unit 200, is greater than first distance d1, by which the bent portion of first flexible printed circuit board 10 is protruded. Specifically, flexible printed circuit boards 10 and 20 can be bent without interfering with each other within a side space that is restricted by third distance d3, which is greater than first distance d1.

According to this comparative embodiment, since third distance d3 is greater than first distance d1, bezel width w is determined by third distance d3. In contrast, according to the aforementioned exemplary embodiment of the present disclosure, since bezel width w is determined by first distance d1, it is possible to reduce bezel width w and dead space.

When third distance d3 of the bent portion of second flexible printed circuit board 20 is reduced by first distance d1 or more, second flexible printed circuit board 20 comes into contact with first flexible printed circuit board 10 to thereby pressurize first flexible printed circuit board 10. Accordingly, first flexible printed circuit board 10 may be bent, thereby generating cracks. Further, when flexible printed circuit boards 10 and 20 contact each other, electrical noise may be generated between signals flowing in flexible printed circuit boards 10 and 20. In contrast, according to the exemplary embodiment of the present disclosure, as shown in FIG. 4, since second distance d2 of the bent portion of second flexible printed circuit board 20 is smaller than first distance d1 of the bent portion of flexible printed circuit board 10, and second flexible printed circuit board 20 does not interfere with first flexible printed circuit board 10, no crack or electrical noise is generated.

Figure 6:
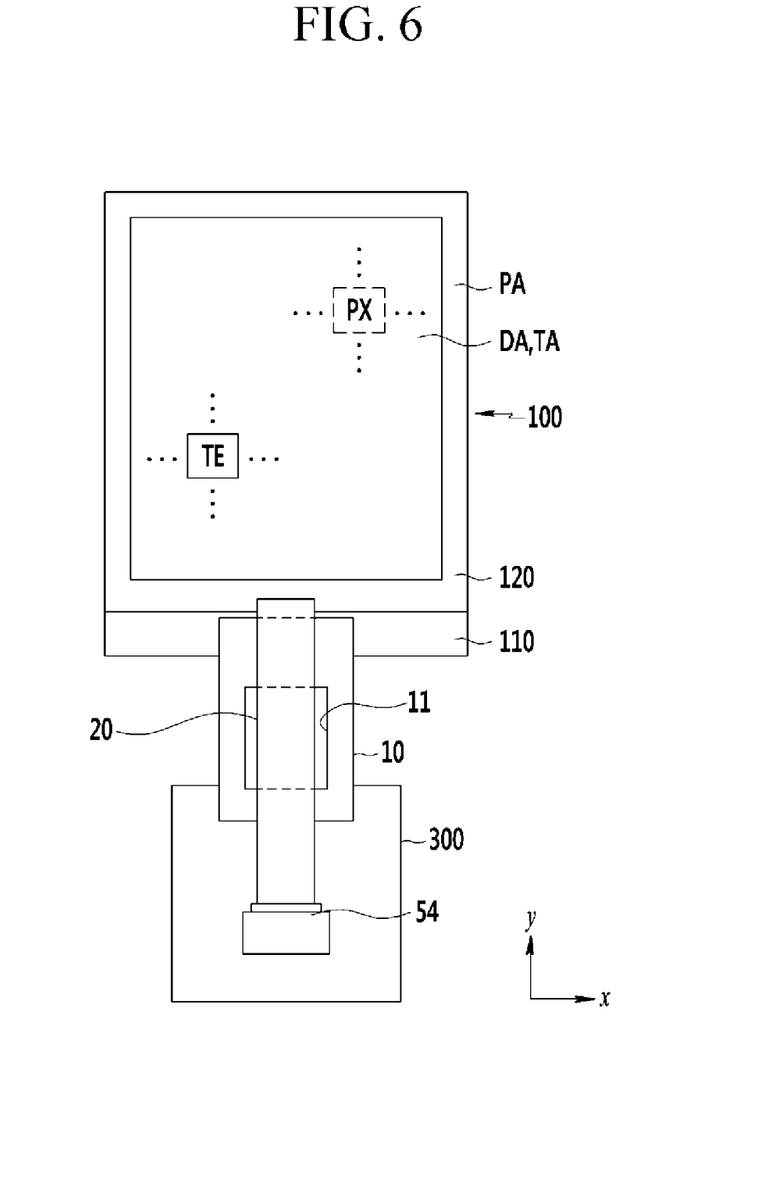
FIG. 6 is a plan view schematically illustrating a structure of a flexible printed circuit board before being bent, in a display device according to another exemplary embodiment of the present disclosure.

In an exemplary embodiment of FIG. 6, the shape of second flexible printed circuit board 20 is different from the shape shown in FIG. 1 to FIG. 4. Specifically, second flexible printed circuit board 20 may have a quadrangular shape of which the entire width is constant. In this case, second flexible printed circuit board 20 also has a width that is narrower than that of opening 11 of first flexible printed circuit board 10, and is connected thereto such that it is overlapped with opening 11 of first flexible printed circuit board 10, but is not overlapped with the side portion thereof. Accordingly, as in the exemplary embodiment of FIG. 4, when printed board assembly 300 is attached to the rear surface of backlight unit 200, the second curvature trajectory of second flexible printed circuit board 20 may be positioned at an inner side of the first curvature trajectory of first flexible printed circuit board 10, and no interference may be generated therebetween.

Figure 7:
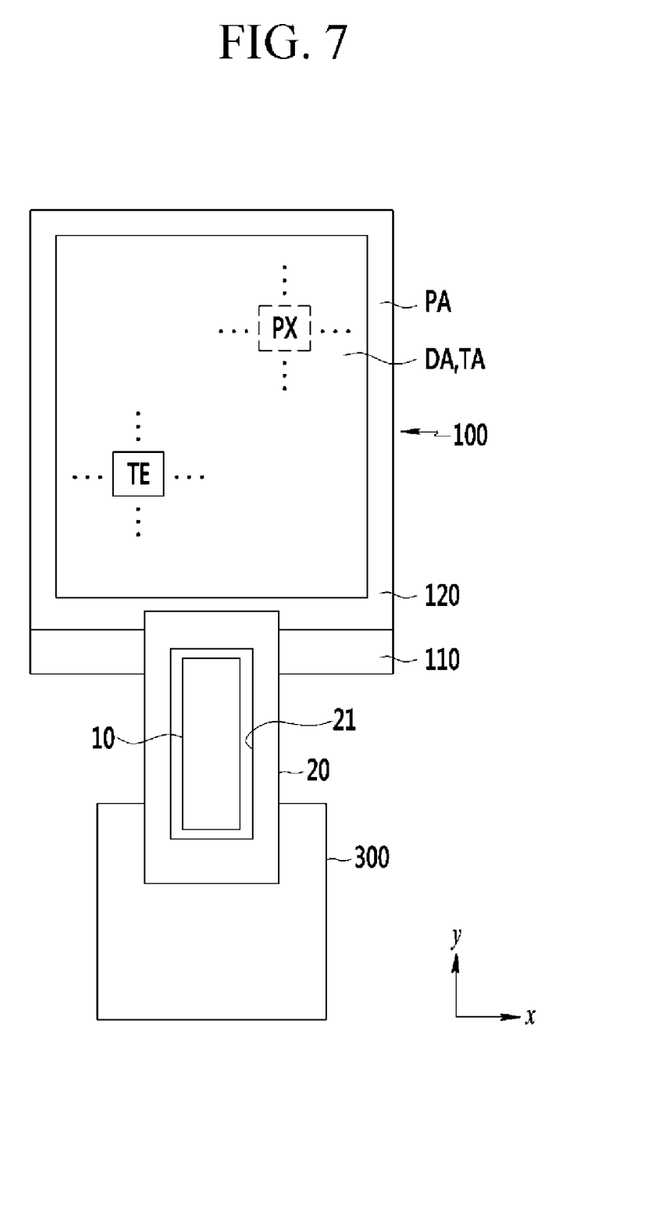
FIG. 7 is a plan view schematically illustrating a structure of a flexible printed circuit board before being bent, in a display device according to yet another exemplary embodiment of the present disclosure.

In the exemplary embodiment of FIG. 7, second flexible printed circuit board 20 has an entirely quadrangular shape and includes opening 21, and first flexible printed circuit board 10 has an entirely quadrangular shape opening 21 of the second flexible printed circuit board 20 is longitudinally formed so as to not cover a lower pad unit (not shown) disposed in lower substrate 110 and a substrate pad unit (not shown) disposed in printed board assembly 300. First flexible printed circuit board 10 is formed to have a length and a width that are shorter and narrower than those of opening 21. First flexible printed circuit board 10 is entirely disposed within opening 21, and a first end and a second end of first flexible printed circuit board 10 are respectively attached to the lower pad unit and the substrate pad unit. With this structure and disposition, no interference is generated when first flexible printed circuit board 10 and second flexible printed circuit board 20 are bent. Accordingly, flexible printed circuit boards 10 and 20 can be formed to have optimized lengths without being restricted to each other. Thus, it is possible to reduce distances by which bent portions thereof are protruded from an edge of lower substrate 110 or a side surface of backlight unit 200, and further reduce dead space and bezel width.

According to an exemplary embodiment, it is possible to bend a touch sensor flexible printed circuit board and a display flexible printed circuit board without interference or twist such that the touch sensor flexible printed circuit board is less protruded than the display flexible printed circuit board. As a result, since the two flexible printed circuit boards do not interfere with each other, cracks and noise is suppressed therein.

In another exemplary embodiment, it is possible to minimize dead space since the bent portion of the touch sensor flexible printed circuit board may be less protruded than the bent portion of the display flexible printed circuit board. Additionally, since dead space is reduced, the bezel width may be reduced and additional space may be used to dispose another structure such as a component or a bracket.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
    a lower substrate;
    an upper substrate facing the lower substrate;
    a printed board assembly disposed on a rear surface of the lower substrate;
    a first flexible printed circuit board comprising a first end and a second end that are respectively connected to the lower substrate and the printed board assembly; and
    a second flexible printed circuit board comprising a first end and a second end that are respectively connected to the upper substrate and the printed board assembly,
    wherein one of the first flexible printed circuit board and the second flexible printed circuit board has an opening at a central portion and the other flexible printed circuit board at least partially overlaps the opening in a plan view, and
    wherein the second flexible printed circuit board comprises the opening, and the first flexible printed circuit board has a width and a length that are narrower and shorter, respectively, than the opening width and length.

2. The display device of claim 1, wherein the first flexible printed circuit board and the second flexible printed circuit board are bent while surrounding at least a portion of one edge of the lower substrate.

3. The display device of claim 1, wherein the opening of the first flexible printed circuit board has a quadrangular shape.

4. The display device of claim 1, wherein the second flexible printed circuit board comprises a portion with a width wider than that of the first flexible printed circuit board.

5. The display device of claim 1, further comprising:
    a display active layer disposed between the lower substrate and the upper substrate; and
    a touch sensing layer disposed on the upper substrate.

6. The display device of claim 5, further comprising a backlight unit disposed below the lower substrate.

7. The display device of claim 6, wherein the printed board assembly is attached to a rear surface of the backlight unit.

8. The display device of claim 1, wherein the first end of the first flexible printed circuit board and the first end of the second flexible printed circuit board are respectively connected to pad units of the lower substrate and the upper substrate through anisotropic conductive layer (ACF) bonding.

* * * * *